United States Patent [19]

Wilens

[11] Patent Number: 4,605,058
[45] Date of Patent: Aug. 12, 1986

[54] HEAT DISSIPATING RETAINER FOR ELECTRONIC PACKAGE

[75] Inventor: Seymour Wilens, Wantagh, N.Y.

[73] Assignee: The Staver Company, Inc., Bay Shore, N.Y.

[21] Appl. No.: 718,743

[22] Filed: Apr. 1, 1985

[51] Int. Cl.[4] ............................................... F28F 7/00
[52] U.S. Cl. .................................. 165/80.2; 165/185; 357/79; 357/81
[58] Field of Search ...................... 165/80.2, 80.3, 185

[56] References Cited

U.S. PATENT DOCUMENTS

| 3,047,648 | 7/1962 | Mowatt | 165/80.3 X |
| 3,187,812 | 6/1965 | Staver | 165/185 |
| 3,407,868 | 10/1968 | Coe | 165/185 |
| 3,572,428 | 3/1971 | Monaco | 165/185 X |

Primary Examiner—William R. Cline
Assistant Examiner—Richard R. Cole
Attorney, Agent, or Firm—Edward H. Loveman

[57] ABSTRACT

A heat dissipating retainer for a flat, rectangular solid state package of electronic components is made from a single piece of pliable, springy electrically conductive sheet material bent to form a generally W-shaped structure. This structure has an inner inverted U-shaped channel section open at its front, back, and bottom ends to receive the package in frictional engagement under spring tension by contact with sides of the channel section. This structure serves as a heat sink by effectively dissipating by conduction, convection and radiation, heat generated in the solid state package of electronic components.

4 Claims, 5 Drawing Figures

HEAT DISSIPATING RETAINER FOR ELECTRONIC PACKAGE

BACKGROUND OF THE INVENTION

1. Field of the Invention

This invention relates to the art of holders for flat packages of electronic components, and more particularly concerns a springy metal retainer for a flat, rectangular solid state package of electronic components.

2. Prior Art

Suitable electronic component holders or retainers are essential for miniature electronic circuits having a large number of heat generating electronic components mounted in very limited space on a circuit board. Various type of holders have heretofore been proposed for supporting flat electronic component packages, but they have not proven wholly satisfactory for a number of reasons. In general, they do not provide adequate means for efficiently dissipating heat generated in the electronic components during operation. With some prior holders it is a difficult, time consuming operation to mount the electronic components. Frequently, special tools and special operator skills are required. In some holders, the electronic components are not held securely enough. Some holders are large and occupy excessive space. Some holders have complex shapes and are expensive to manufacture.

3. Summary of the Invention

The present invention is directed at overcoming the above and other difficulties and disadvantages of prior electronic component holders. According to the invention, there is provided a springy metal, clip-like, rather W-shaped retainer for a flat, straight, in-line package of solid state electronic components. The retainer has an inside springy bight portion with inner spaced lateral walls which grip the electronic package frictionally and securely under tension. The retainer has outer walls or wings provided with struck out louvers. Integral tabs or tongues for mounting the retainer on a circuit board may also be provided. The retainer construction is such that heat generated in the electronic components is effectively and completely dissipated by convection, conduction, and radiation. The retainer thus serves as an efficient heat sink.

4. Objects of the Invention

It is therefore a principal object of the present invention to provide a holder for a flat electronic component package.

It is another object of the present invention to provide a holder of the type aforedescribed having means for dissipating heat generated by the components in the package.

It is another object of the present invention to provide a holder of the type aforedescribed having integral means for mounting the holder on a circuit board.

These and other objects and many of the attendant advantages of this invention will be readily appreciated as the same becomes better understood by reference to the following detailed description when considered in connection with the accompanying drawings in which:

Figure 1:
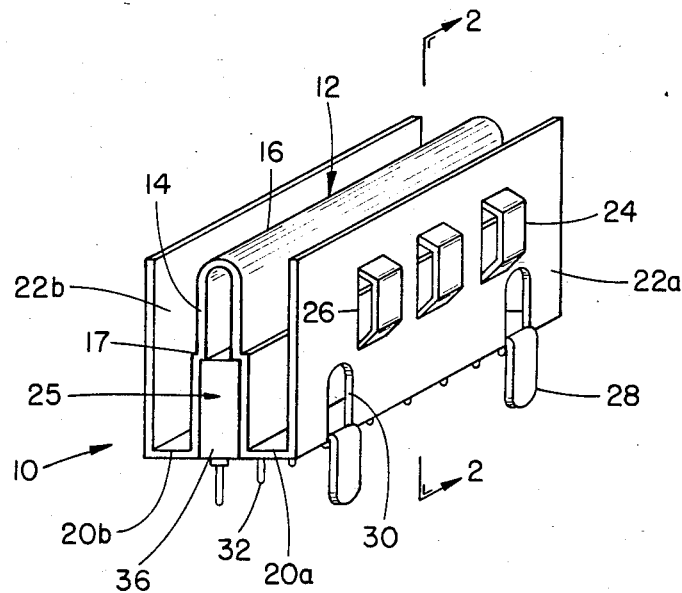
FIG. 1 is a perspective view of a heat sink retainer embodying the invention, with an electronic component package shown mounted in the retainer.
Figure 3:
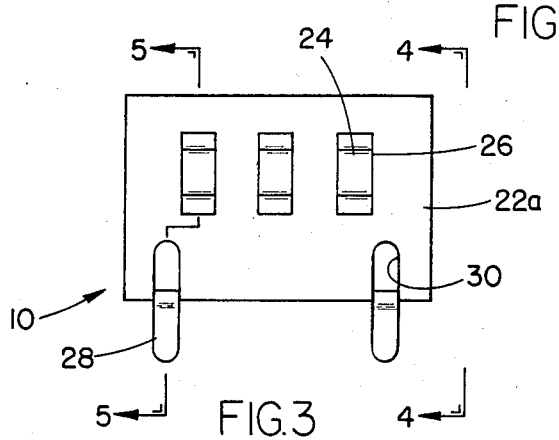
FIG. 3 is a side view of the retainer per se.

Referring now to the drawings wherein like reference characters designate like or corresponding parts throughout, there is illustrated in FIGS. 1–5, a retainer or holder generally designated as reference numeral 10 embodying the invention. The retainer 10 is generally W-shaped and is formed from a single thin strip or sheet of highly electrically conductive, pliable, springy metal such as half-hardened copper. The metal may be solder-coated on both sides. The retainer 10 has a long, integral, inverted U-shaped channel section 12 formed with spaced, flat, upper side walls 14 integral with a long springy ridge or bight 16. The channel shaped section 12 has outwardly flaring shoulder portions 17 and lower side walls 18 laterallly spaced apart more widely than the walls 14. The section 12 is open at opposite front and back ends and at its bottom end. At bottom ends of the lower walls 18 the material of the structure is bent outwardly to define substantially coplanar narrow, flat bottom walls 20a, 20b. Extending upwardly from outer edges of the walls 20a, 20b are outer side walls 22a, 22b. A plurality of tabs 24 are struck outwardly from both of the side walls 22a, 22b to define openings or louvers 26 which are spaced apart in a direction longitudinally of the retainer 10 and parallel to the ridge or bight 16. Two further tabs or tongues 28 may be struck out of side wall 22a and bent downwardly leaving elongated holes 30. The tongues 28 extend downwardly from the walls 20a and 22b a sufficient distance to be inserted into sockets or apertures in a circuit board where they are soldered in place.

Figure 4:
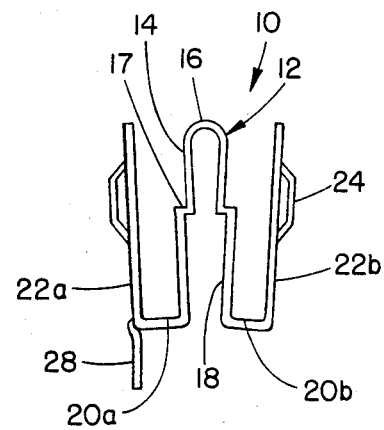
FIG. 4 is an end view of the retainer, taken along line 4—4 of FIG. 3.
Figure 2:
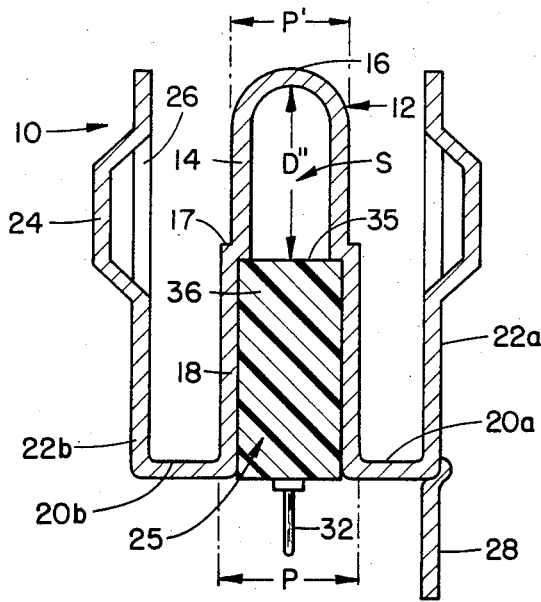
FIG. 2 is an enlarged cross sectional view taken along line 2—2 of FIG. 1.
Figure 5:
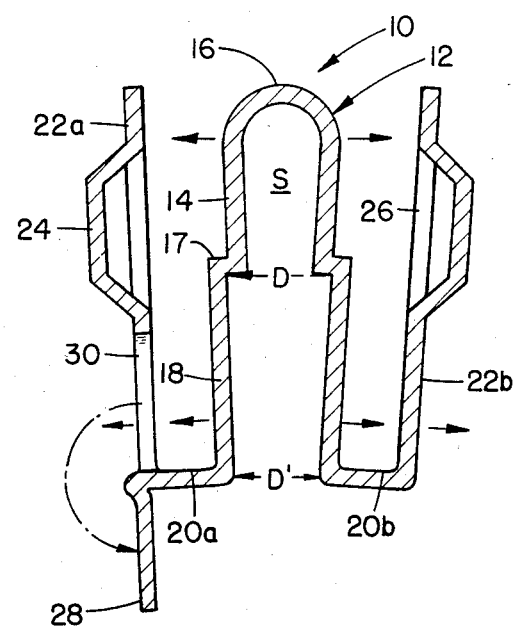
FIG. 5 is an enlarged cross sectional view of the retainer, taken along line 5—5 of FIG. 3.

In normal unstressed condition, the retainer 10 as best shown in FIGS. 4 and 5 has the inner, lower side walls 18 inclined slightly inwardly toward each other. Thus a distance D which is the spacing between the walls 18 at the shoulder portions 17 is greater than a distance D' at end edges of the walls 18. The ridge or bight 16 is springy, so that the walls 14, 18 can be moved apart as indicated by arrows in FIG. 5, when inserting a flat, in-line component package 25 as shown in FIGS. 1 and 2. The walls 18 will then assume parallel position P and will frictionally engage the sides of the package 25 while the bight 16 is tensioned.

When the package 25 is inserted into the retainer 10, a top wall 35 of the package 25 contacts the shoulder portions 17 of the section 12 to serve as abutments and to hold the package 25 securely in place. The package 25 has an insulative body 36 containing electronic components such as transistors, capacitors, resistors in an integral circuit connected to a plurality of terminal pins 32 which extend downwardly from the bottom of the body 36 at the bottom of the retainer 10. The pins 32 can be inserted into sockets in a circuit board and/or soldered into an electronic circuit.

It will be noted that the package can be easily inserted into the channel 12 which has an open bottom and ends. Normally, the walls 14, 18 will be inclined slightly toward each other as best shown in FIG. 5, but when the package 25 is inserted, the side walls 14 and 18 assume parallel positions P, P' while the ridge or bight 16 flexed and tensioned. Outer walls 22a, 22b normally flare outwardly slightly, as shown in FIG. 5, but assume a parallel position when the package 25 is inserted, as shown in FIG. 2.

Heat generated in the electronic package 25 is conducted away by the walls 18, 20a, 20b, 22a, 22b of the retainer 10. The heat is also conveyed by air convection currents through space S in the channel 12 between the top of the package 25 and the inner side of the bight 16. Heat is further dissipated by convection through the louvers 26 and the holes 30 in the side walls 22a, 22b. Heat also radiates away from the package downwardly from the open bottom of the channel 12 and upwardly to the adjacent walls 14 and bight 16. From the walls 14, 16 of the retainer 10 the heat is dissipated by convection and radiation.

The retainer 10 is constructed to insure maximum heat dissipation while occupying minimum space. The intimate contact between the sides of the package 25 and adjacent sides of the retainer 10 maximizes heat conduction, while maintaining perfect electric grounding of the component package via the integral tabs 28 which may be fastened by soldering to a printed circuit board. The relatively long distance D'' between the ridge or bight 16 and then shoulders 17 enhances the spring action of the section 12 so that the side walls 14 assume parallel positions in firm contact with the side walls of the package 25. The shoulders 17 serve as stops or abutments to engage the top of the electronic package 25 when it is inserted into the channel 12. The package 25 is insertable into the retainer 10 without the aid of any tools or special skills.

The retainer 10 is a one-piece structure which may be manufactured at minimum cost by mass production metal working methods and machinery well known in the art. The retainers 10 may be manufactured in various lengths, widths, and thicknesses to accomodate electronic packages of various sizes. If desired the tab 28 may be dispensed with and grounding of the retainer 10 may be accomplished by soldering the walls 20a, 20b to the printed circuit board.

It should be understood that the foregoing relates to only a preferred embodiment of the invention which has been by way of example only and that it is intended to cover all changes and modifications of the example of the invention herein chosen for the purpose of the disclosure, which do not constitute departures from the spirit and scope of the invention.

What is claimed is:

1. A retainer for a flat, rectangular package of electronic components, comprising:

a generally W-shaped structure having an inner, inverted, U-shaped channel section open at opposite front, back, and bottom ends to receive said flat package of electronic components in frictional engagement under spring tension with sides of said package;

said structure further having a pair of outer side walls laterally spaced from said channel section by integral inner bottom walls to dissipate by conduction, convection and radiation heat generated in said package; and wherein said channel section comprises:

an upper springy ridge integral with a pair of laterally spaced first inner walls;

a pair of outwardly flaring narrow bent wall portions respectively integral with said first inner walls to serve as abutments for limiting insertion of said package into said channel section; and a pair of second inner walls respectively integral with said bent wall portions and with said inner bottom walls, said second inner walls normally being inclined toward each other, and assuming parallel position only when said package is inserted into said channel section while said springy ridge flexes to retain said package in said channel section under said spring tension.

2. A retainer as defined in claim 1, wherein said structure is formed from a single piece of pliable, springy, electrically conductive sheet material.

3. A retainer as defined in claim 1, wherein said outer side walls have louvers to facilitate dissipating heat generated in said package.

4. A retainer as defined in claim 3, wherein said structure is further formed with tongues struck out of at least one of said outer side walls and bent to project downwardly for mounting said structure on a circuit board.

* * * * *